(12) United States Patent
Han et al.

(10) Patent No.: US 12,707,907 B2
(45) Date of Patent: Aug. 11, 2026

(54) CONTROL AND LOCALIZATION OF POROSITY IN III-NITRIDES AND METHODS OF USING AND MAKING THEREOF

(71) Applicant: Yale University, New Haven, CT (US)

(72) Inventors: Jung Han, New Haven, CT (US); Rami Elafandy, Hamden, CT (US)

(73) Assignee: Yale University, New Haven, CT (US)

( * ) Notice: Subject to any disclaimer, the term of this patent is extended or adjusted under 35 U.S.C. 154(b) by 758 days.

(21) Appl. No.: 17/794,511

(22) PCT Filed: Nov. 23, 2020

(86) PCT No.: PCT/US2020/061792
§ 371 (c)(1),
(2) Date: Jul. 21, 2022

(87) PCT Pub. No.: WO2021/167666
PCT Pub. Date: Aug. 26, 2021

(65) Prior Publication Data

US 2023/0052931 A1 Feb. 16, 2023

Related U.S. Application Data

(60) Provisional application No. 62/964,724, filed on Jan. 23, 2020.

(51) Int. Cl.

| | |
|---|---|
| ***H10P 30/20*** | (2026.01) |
| ***H01S 5/183*** | (2006.01) |
| ***H10D 62/85*** | (2025.01) |
| ***H10P 50/61*** | (2026.01) |
| ***H10P 50/64*** | (2026.01) |

(52) U.S. Cl.
CPC ........ *H10P 30/206* (2026.01); *H01S 5/18361* (2013.01); *H10D 62/8503* (2025.01); *H10P 30/212* (2026.01); *H10P 50/617* (2026.01); *H10P 50/646* (2026.01)

(58) Field of Classification Search
None
See application file for complete search history.

(56) References Cited

U.S. PATENT DOCUMENTS

| | | | |
|---|---|---|---|
| 9,583,353 | B2 | 2/2017 | Han |
| 11,018,231 | B2 | 5/2021 | Han |
| 11,043,792 | B2 | 6/2021 | Han |

(Continued)

FOREIGN PATENT DOCUMENTS

| | | |
|---|---|---|
| CN | 107710381 | 2/2018 |
| EP | 3298624 | 3/2018 |

(Continued)

OTHER PUBLICATIONS

Spiridon et al, 2018, 'On-Chip Thermal Insulation Using Porous GaN', Proceedings, 2, 776, pp. 1-5. (Year: 2018).*

(Continued)

*Primary Examiner* — Feifei Yeung Lopez
(74) *Attorney, Agent, or Firm* — PABST PATENT GROUP LLP

(57) ABSTRACT

III-Nitride layers having spatially controlled regions or domains of porosities therein with tunable optical, electrical, and thermal properties are described herein. Also disclosed are methods for preparing and using such III-nitride layers.

26 Claims, 5 Drawing Sheets

(56) References Cited

U.S. PATENT DOCUMENTS

| | | | | |
|---|---|---|---|---|
| 12,588,433 | B2 | 3/2026 | Han et al. | |
| 2011/0140083 | A1 | 6/2011 | Driscoll | |
| 2013/0011656 | A1 | 1/2013 | Zhang | |
| 2013/0334555 | A1 | 12/2013 | Hsieh | |
| 2014/0003458 | A1 | 1/2014 | Han | |
| 2014/0203292 | A1 | 7/2014 | Hwang | |
| 2015/0303655 | A1 * | 10/2015 | Han | H01S 5/18363 438/32 |
| 2016/0197151 | A1 | 7/2016 | Han | |
| 2017/0133826 | A1 | 5/2017 | Han | |
| 2017/0237234 | A1 * | 8/2017 | Han | H01S 5/1042 372/45.012 |
| 2018/0152003 | A1 * | 5/2018 | Han | H01S 5/2009 |
| 2022/0384187 | A1 | 12/2022 | Han et al. | |
| 2023/0052931 | A1 | 2/2023 | Han | |
| 2024/0222937 | A1 | 7/2024 | Han et al. | |

FOREIGN PATENT DOCUMENTS

| | | | |
|---|---|---|---|
| JP | 2014507069 | A | 3/2014 |
| JP | 2018502436 | A | 1/2018 |
| JP | 2018517295 | | 6/2018 |
| WO | 2016054232 | | 4/2016 |
| WO | 2016187421 | | 11/2016 |
| WO | 2020231714 | A1 | 11/2020 |
| WO | 2022185766 | A1 | 9/2022 |
| WO | 2022235615 | A1 | 11/2022 |

OTHER PUBLICATIONS

Chen, et al., "Nanopores in GaN by electrochemical anodization in hydrofluoric acid: Formation and mechanism", J. Appl. Phys, 112 (6): 064303 (2012).

Kucheyev, et al., "Ion-beam-induced porosity of GaN", Applied Physics Letters, 77 (10), 1455-1457 (2000).

Mishkat-Ui-Masabih, et al., "Electrically injected nonpolar GaN-based VCSELs with lattice-matched nanoporous distributed Bragg reflector mirrors", Applied Physics Express, 12(3): 036504. (2019).

Youtsey, et al., "Highly anisotropic photoenhanced wet etching of n-type GaN", Appl. Phys. Lett, 71(15): 2151-2153 (1997).

Zhang, et al., "Mesoporous GaN for Photonic Engineering-Highly Reflective GaN Mirrors as an Example", ACS Photonics, 2(7): 980-986 (2015).

International Search Report for PCT /US2020/061792 May 31, 2018.

International Preliminary Report on Patentability for International Application No. PCT/US2016/033270, mailed Nov. 30, 2017.

International Preliminary Report on Patentability, mailed Aug. 9, 2012 for Application No. PCT/US2011/022701.

Extended European Search Report for European Application No. 11737629.3, dated Oct. 12, 2017, 9 pages.

Extended European Search Report for European Application No. 15846362.0, dated Apr. 24, 2018, 10 pages.

Extended European Search Report for European Application No. 16797298.3, dated Dec. 3, 2018, 6 pages.

International Preliminary Report on Patentability for International Application No. PCT/US2013/046852, mailed Jan. 8, 2015, 9 pages.

International Preliminary Report on Patentability for International Application No. PCT/US2015/053254, mailed Apr. 13, 2017, 11 pages.

International Search Report and Written Opinion for International Application No. PCT/US2011/022701, mailed Apr. 8, 2011, 11 pages.

International Search Report and Written Opinion for International Application No. PCT/US2013/046852, mailed Oct. 29, 2013, 10 pages.

International Search Report and Written Opinion for International Application No. PCT/US2015/053254, mailed Dec. 29, 2015, 12 pages.

International Search Report and Written Opinion for International Application No. PCT/US2016/033270, mailed Aug. 25, 2016, 10 pages.

International Search Report received for PCT Patent Application No. PCT/US2020/061794, mailed on Feb. 10, 2021, 3 pages.

International Search Report received for PCT Patent Application No. PCT/US2022/027391, mailed on Aug. 16, 2022, 4 pages.

Zhang, et al., "Supporting Information Mesoporous GaN for Photonic Engineering—Highly Reflective GaN Mirrors as an Example", ACS Photonics, Jun. 30, 2015, 5 pages.

* cited by examiner

CONTROL AND LOCALIZATION OF POROSITY IN III-NITRIDES AND METHODS OF USING AND MAKING THEREOF

CROSS-REFERENCE TO RELATED APPLICATIONS

This application is a National Phase application under 35 U.S.C. 371 of PCT/US2020/061792, filed Nov. 23, 2020, which claims the benefit of and priority to U.S. Provisional Application No. 62/964,724 filed Jan. 23, 2020, which are hereby incorporated by reference in their entirety.

STATEMENT REGARDING FEDERALLY SPONSORED RESEARCH

This invention was made with government support under HR0011-16-2-0037 awarded by Defense Advanced Research Project Agency and under ECCS-1709149 awarded by National Science Foundation. The government has certain rights in the invention.

FIELD OF THE INVENTION

This invention is in the field of III-nitrides, such as GaN, and their alloys which have spatially controlled areas of porosity and can be used in electronic applications, such as photonic devices.

BACKGROUND OF THE INVENTION

The etching of semiconductor materials is an important technique that is used in microfabrication processes. Various kinds of etching recipes have been developed for many materials used in semiconductor manufacturing. For example, Si and certain oxides may be etched using dry (e.g., reactive-ion etching) or wet chemical etching techniques that yield desired etch rates and etch morphologies. III-nitride materials and its alloys have recently emerged as attractive materials for some semiconductor applications, because of the materials' desirable physical and electronic properties. Nevertheless, there appears to be an apparent performance ceiling which needs to be overcome to address the inherent material constraints in III-nitride materials to date.

Therefore, there is a need for III-nitrides having spatially controlled/tuned porosities and physical properties.

There also is a need for improved methods of making such III-nitrides having spatially controlled/tuned porosities and physical properties.

Therefore, it is an object of the invention to provide such III-nitrides having spatially controlled/tuned porosities and physical properties.

It is yet another object of the invention to provide methods for preparing such III-nitrides.

It is still a further object of the invention to provide methods of using the described porous III-nitrides.

SUMMARY OF THE INVENTION

Nitrides and alloys thereof with spatially controlled porosities are described herein. Further, the ability to form three-dimensional structures of III-nitride/porous III-nitrides with spatial control by combining conductivity selective electrochemical (EC) etching with ion implants are also described. Spatial control of the porosity of such materials allows for the tuning/control and the optimization of the local electrical, thermal, optical properties of devices containing porous III-nitride domains and regions therein.

Wide bandgap III-nitrides include aluminum nitrides, gallium nitrides, indium nitrides, and alloys thereof. In certain instances, the wide bandgap III-nitride is a gallium nitride (GaN) which has domains and regions therein which are controllably porosified by a combination of conductivity selective EC etching using ion implants according to the methods described. Controlled porosification of one or more selected regions or domains within the layer or layers of III-nitride requires controlling and localizing where the EC etching occurs.

Selective and controlled porosification of doped III-nitride regions or domains rely on introduction of one or more ion implants into pre-defined and selected regions or domains of doped layer(s) of bulk III-nitride allowing for a reduction in the electrical conductivity of the ion implanted regions or domains sufficient to prevent their porosification under EC etching conditions. Non-ion implanted doped regions or domains in the at least one layer of a doped III-nitride retain at least the same electrical conductivity, as compared to the bulk pristine III-nitride, or greater than about 99%, 95%, 90% of the electrical conductivity. The use of an ion implant mask layer also allows for the creation of micro-scale patterns which permit selective porosification of only doped regions or domains within the doped III-nitride layer(s), which were masked and not exposed to ion implants.

Electrochemical etching leaves the ion implanted regions or domains of the layer or layers intact with little (i.e., less than 5%, 4%, 3%, 2%, 1% porosity) to no porosification and porosifies only the doped regions or domains of the layer or layers of III-nitrides, which were not ion implanted. The porosification of the doped regions or domains of the III-nitrides produces porosities within these regions or domains in the range of between about 1% and 90% or 20% and 80%. In some instances, the porosity is at least about 1%, 5%, 10%, 20%, 30%, 40%, 50%, 60%, 70%, 80%, or 90%. In some cases, the doped regions or domains of the III-nitride layer(s) are etched away completely under the EC etching conditions applied.

The porosification of pre-defined and selected regions or domains of the doped III-nitride layer(s) proceeds by an electrochemical (EC) etching process, as discussed above, and different degrees of porosities and pore morphologies may be obtained by changing the type and concentration of electrolyte (either salt or acid), doping concentration, and applied bias voltage, as discussed in greater detail below. For example, columnar vertically or laterally aligned pores, or dendritic pore morphologies can be achieved due to the pore growth mechanisms operating during EC etching.

In some instances, the layer(s) of III-nitride can form part of a multilayer structure. The multilayer structure includes at least one layer of the III-nitride layer having porous regions or domains therein and further includes at least one layer of an optionally n-type doped bulk non-porous III-nitride. Within such multilayer structure, the at least one layer of the III-nitride layer can form an interface with the least one layer of optionally n-type doped bulk non-porous III-nitride. In some instances, the multilayer structure comprises multiple layers of each type, which may alternate in type, and multiple interfaces between the alternating pairs of layers are formed.

The conductivity selective electrochemical (EC) etching methods described herein rely on electrically injected holes, rather than photogenerated holes, to oxidize pre-determined domains and regions within bulk layer(s) of doped III-nitrides, such as GaN. The methods described herein do not require exposure to ultraviolet (UV) illumination. The etching behavior of the doped III-nitride is well controlled during the EC etching process by the incorporation of ion implants which reduce electrical conductivity and prevent porosification during EC etching. Thus, a variety of porosities and pore morphologies can be obtained by way of the ion implants introduced, as described below.

In one non-limiting example of the method, a III-nitride layer or layers having predefined regions or domains of porosity are formed by the steps of:

(a) growing or providing at least one layer of a doped III-nitride over a first undoped III-nitride layer (i.e., first layer) and growing or depositing a second undoped III-nitride layer (i.e., second layer) over the at least one layer of doped III-nitride;

(b) forming or depositing an ion implant mask layer over one or more areas of the second undoped III-nitride layer;

(c) implanting ions into the at least one layer of doped III-nitride to form ion implanted domains or regions therein which have reduced electrical conductivity, as compared to non-ion implanted doped regions or domains in the at least one layer of a doped III-nitride;

(d) optionally removing the ion implant mask layer;

(e) optionally patterning or etching the doped and undoped III-nitride layers to form an opening (i.e., a trench) to expose one or more regions or domains of the at least one layer of a doped III-nitride, which were not ion implanted during step (c); and (f) electrochemically (EC) etching the at least one layer of doped III-nitride in the presence of an electrolyte and under an applied bias voltage to form one or more etched regions or domains within each comprising a plurality of pores in the exposed one or more regions or domains of the doped III-nitride, which were not ion implanted during step (c).

Porosification by EC etching requires that the bulk III-nitride layer(s) be doped/implanted with an n-type dopant. Accordingly, at least one layer of a doped III-nitride is doped during deposition/formation step (b).

Introducing ion implant mask layer(s) over one or more areas of the undoped layer protects the masked areas from ion implants. The one or more regions or domains which are non-ion implanted and which can be porosified by the EC etching process can have any size, area, or shape based on the ion implant mask layer parameters (i.e., size, area, shape) and the ion implant exposure parameters (i.e., ion source and energy) which control the depth of the ion implant. Based on the pattern, size, shape, or area of the ion mask layer(s) the resulting ion implanted regions or domains formed in the at least one layer of a doped III-nitride can have any suitable pattern, size, shape, area, or depth.

The reduction in electrical conductivity caused by introducing ion implants into doped regions or domains of the III-nitride layer(s) can be by at least 10, 20, 30, 40, 50, 60, 70, 80, or 90%, as compared to the electrical conductivity prior to ion implantation. The non-ion implanted doped regions or domains in the at least one layer of a doped III-nitride retain at least the same electrical conductivity, as compared to the bulk pristine III-nitride, or greater than about 99%, 95%, 90% of the electrical conductivity.

EC etching leaves the ion implanted regions or domains of the layer or layers intact with little (less than 5%, 4%, 3%, 2%, 1%, or less) to no porosification and porosifies only the doped regions or domains of the layer or layers of III-nitrides, which were not ion implanted. The degree of porosity of doped regions or domains within III-nitride layer(s) which were not ion implanted can be controlled as a function of two parameters: the doping (carrier) concentration and the anodization or applied bias voltage. Different porosities and pore morphologies can result by changing the type and concentration of electrolyte, doping concentration, and applied bias voltage.

The incorporation of low index materials, such as air, into porosified regions or domains within III-nitride layer(s) can lower the refractive index. The EC etching allows for tunability in the refractive index of the porosified regions or domains of III-nitrides. The methods described can also be used to tune the electrical properties of the porous regions or domains within doped III-nitride layer(s), as compared to the bulk (non-porous) equivalent III-nitride. In some instances, the porosification of III-nitride, as described herein, results in about an order of magnitude decrease in the electron concentration after the EC etching process has occurred. Further, the thermal conductivity of III-nitrides can be tuned based on the porosity and average pore wall thickness of the resulting porosified regions or domains within the doped III-nitride layer(s).

The one or more layers of III-nitride(s), which have controllably localized and etched porous regions or domains therein, can be used in electronic, photonic, and optoelectronic applications. The spatial control in porosity can impact in several applications which require three-dimensional control over the optical, electrical, thermal or mechanical properties of III-nitrides. These can include, but are not limited to optoelectronic devices including light-emitting diodes (such as, resonant-cavity LEDs (RC-LEDs)), field-effect transistors, laser diodes (vertical-cavity surface-emitting lasers (VCSELs)), distributed feedback (DFB) laser and edge emitting lasers, 3-D photonic crystals, flexible membranes, micro- and nano-fluidics, biomedical diagnostics, bio-platforms, and water splitting. Such layers can prepared according to the methods described herein and these can be incorporated into different devices using art known techniques.

The inclusion of selective porosity regions or domains in III-nitride-containing reflectors/mirrors provides the option of a conductive mirror to support vertical current injection vital in attaining high performance VCSELs with excellent optical and electrical performance, as compared to previously reported VCSELs. VCSELs have many advantages compared to more commonly used edge emitting laser diodes (EELDs) such as superior beam quality, compact form factor, low operating power, cost-effective wafer-level testing, higher yield and lower cost in manufacturing. VCSELs, in general, are expected to find important applications in various fields including information processing, micro-display, pico-projection, laser headlamps, high-resolution printing, biophotonics, spectroscopic probing, and atomic clocks.

DETAILED DESCRIPTION OF THE INVENTION

I. Definitions

Figure 1:
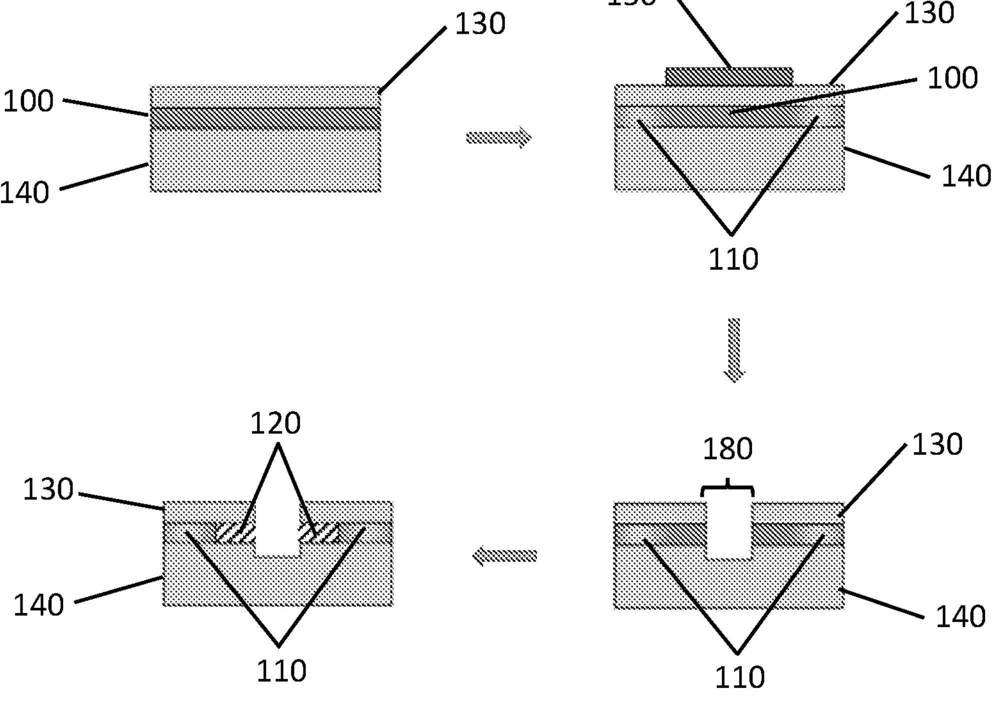
FIG. 1 shows a non-limiting representation of the localized etching process described by first forming a doped III-nitride layer 100 in between a first undoped III-nitride layer 140 and a second undoped III-nitride layer 130 onto which an ion implant mask layer 150 is deposited followed by introduction of ion implants 110. A trench or via 180 is formed by patterning or etching the layers and subsequently porous regions or domains of III-nitride 120 are formed by electrochemical etching of non-ion implanted regions or domains.

"Porosity," as used herein refers to the volumetric ratio of air present in a porosified medium, such as a III-nitride layer(s), which is expressed as a percentage.

"Refractive Index" or "Index of Refraction," are used interchangeably and refer to the ratio of the velocity of light in a vacuum to its velocity in a specified medium, such as a layer of a III-nitride, according to the formula n=c/v, where c is the speed of light in vacuum and v is the phase velocity of light in the medium.

"Refractive Index Contrast," as used herein refers to the relative difference in refractive index between two mediums having different indices of refraction and which are in contact and form an interface.

"Bulk III-nitride," as used herein refers to an unetched pristine III-nitride.

Numerical ranges disclosed in the present application include, but are not limited to, ranges of temperatures, ranges of times, ranges of bias voltages, ranges of porosities, ranges of thermal conductivities, ranges of integers, and ranges of thicknesses, amongst others. The disclosed ranges, disclose individually each possible number that such a range could reasonably encompass, as well as any sub-ranges and combinations of sub-ranges encompassed therein. For example, disclosure of a time range is intended to disclose individually every possible time value that such a range could encompass, consistent with the disclosure herein.

Use of the term "about" is intended to describe values either above or below the stated value, which the term "about" modifies, in a range of approx. +/−10%; in other instances the values may range in value either above or below the stated value in a range of approx. +/−5%. When the term "about" is used before a range of numbers (i.e., about 1-5) or before a series of numbers (i.e., about 1, 2, 3, 4, etc.) it is intended to modify both ends of the range of numbers and/or each of the numbers recited in the entire series, unless specified otherwise.

II. III-Nitrides and Alloys Thereof with Spatially Controlled Porosity

The ability to form three-dimensional structures of III-nitride/porous III-nitrides with spatial control by combining conductivity selective electrochemical (EC) etching with ion implants is described herein. Spatial control of the porosity allows for the control and the optimization of the local electrical, thermal, optical properties of devices containing porous III-nitride domains and regions therein.

Wide bandgap III-nitrides include aluminum nitrides, gallium nitrides, indium nitrides, and alloys thereof. In certain instances, the wide bandgap III-nitride is a gallium nitride (GaN) which has domains and regions therein which are controllably porosified by a combination of conductivity selective EC etching using ion implants according to the methods described below.

One or more layers of III-nitrides, such as GaN, can be grown epitaxially or homoepitaxially according to art known methods. In some instances, the III-nitride layer can be grown, for example, on a suitable substrate (i.e., c-plane of sapphire) by metal organic chemical vapor deposition (MOCVD). A layer of a porosified III-nitride may have a thickness in a range of between about 10 to 10,000 nm, 10 to 1000 nm, 10 to 500 nm. In some instances, the porosified III-nitride has a thickness which is uniform across the layer. In some other instances, the thickness may be non-uniform across a porosified III-nitride layer.

Controlled porosification of one or more selected regions or domains within the layer or layers of III-nitride requires controlling and localizing where the EC etching occurs. A layer or layers of epitaxially grown III-nitrides need to be doped with an n-type dopant. Exemplary dopants include, but are not limited to n-type Ge and Si dopants. Such dopant sources can include, for example, silane ($SiH_4$), germane ($GeH_4$), and isobutylgermane (IBGe) which can be doped into layer(s) of III-nitrides during their formation/deposition. In some embodiments the III-nitrides which are porosified are aluminum free or substantially free of aluminum (where "substantially free" means less than about 5%, 4%, 3%, 2%, 1%, 0.9%, 0.8%, 0.7%, 0.6%, 0.5%, 0.4%, 0.3%, 0.2%, or 0.1% aluminum by weight in the doped III-nitride layer). In yet some other embodiments, the III-nitrides which are porosified contain aluminum and can be classified as aluminum rich III-nitrides (such as containing greater than 10%, 20%, 30%, 40%, or 50%, or greater aluminum by weight in the doped III-nitride layer). The doping concentration can be uniform across the entirety of a III-nitride layer or the doping concentration may form a gradient (i.e., a III-nitride layer having a graded dopant concentration across an axis of the layer, such width). The doping concentration is considered high at doping concentration levels of at least about $1\times10^{20}$ cm$^{-3}$ or higher; or in the range of between about $0.5\times10^{20}$ cm$^{-3}$ to $10\times10^{20}$ cm$^{-3}$. The doping concentration is considered to be moderate at doping concentration levels of greater than about $1\times10^{18}$ cm' to less than $1\times10^{20}$ cm$^{-3}$, $2\times10^{18}$ cm$^{-3}$ to less than $1\times10^{20}$ cm$^{-3}$, $3\times10^{18}$ cm$^{-3}$ to less than $1\times10^{20}$ cm$^{-3}$, $4\times10^{18}$ cm$^{-3}$ to less than $1\times10^{20}$ cm$^{-3}$, or $5\times10^{18}$ cm$^{-3}$ to less than $1\times10^{20}$ cm$^{-3}$.

In some instances, the moderately doped concentration level is in the range of $1\times10^{19}$ $cm^{-3}$ to less than $1\times10^{20}$ $cm^{-3}$ or in the range of about $0.5\times10^{19}$ $cm^{-3}$ to $10\times10^{19}$ $cm^{-3}$. The doping concentration is considered to be low at doping concentration levels of less than about $1\times10^{18}$ $cm^{-3}$ or in the range of between about $0.5\times10^{18}$ $cm^{-3}$ to $10\times10^{18}$ $cm^{-3}$.

Selective and controlled porosification of doped III-nitride regions or domains rely on introduction of one or more ion implants into pre-defined and selected regions or domains of doped layer(s) of bulk III-nitride allowing for a reduction in the electrical conductivity of the ion implanted regions or domains sufficient to prevent their porosification under EC etching conditions. The reduction in electrical conductivity caused by introducing ion implants into doped regions or domains of III-nitride layer(s) can be by at least 10, 20, 30, 40, 50, 60, 70, 80, or 90%, as compared to the electrical conductivity prior to ion implantation. The non-ion implanted doped regions or domains in the at least one layer of a doped III-nitride retain at least the same electrical conductivity, as compared to the bulk pristine III-nitride, or greater than about 99%, 95%, 90% of the electrical conductivity. The use of an ion implant mask layer also allows for the creation of micro-scale patterns which permit selective porosification of only doped regions or domains within the doped III-nitride layer(s), which were masked and not exposed to ion implants. One or more ion implant mask layers can be used which have any size, area, or shape to controllably select which domains and regions of the doped III-nitride layer(s) are masked from the ion implant.

Ion implant masks can be formed using several methods. Without limitation, some examples include:

(1) Photoresist method: A layer of photoresist is spin coated onto a substrate. Then using photolithography, electron beam lithography or stamping techniques, the photoresist mask layer can be pattered into the desired shape. Based on the source of ions and ion energies used, the mask layer can vary from less than about 1 μm to greater than 10 μm, as needed.

(2) Hard mask, etching method: A hard mask layer of a material is deposited. This material can be dielectric (such as, for example, silicon dioxide or silicon nitride) or a metal, such as titanium, aluminum, etc. Based on the material, different deposition techniques can be used such as, for example, thermal evaporators, electron beam evaporators, sputters, spin coating, chemical vapor deposition, atomic layer depositions, etc. Then a layer of photoresist can be spin coated and patterned on top of the deposited hard mask layer of material. Then the hard mask layer of material can be etched away, either chemically or physically, in order to transfer the patterns from the photoresist to the underlying layer of the material.

(3) Hard mask, liftoff method: Similar to the above technique (hard mask, etching method) but carried out in reverse order. First, a layer of photoresist is spin coated and then patterned. Then, a hard mask layer is deposited on top of the photoresist using one of the techniques previously described in (2). The photoresist is then etched away causing the lifting off of regions within the hard mask layer thus transferring the pattern to the hard mask layer. The ion implants are made only in the exposed areas of the doped III-nitride layer(s) which are not masked. The ion implant ions can come from various ion sources. Many ion species and sources can be used, such as aluminum, gold, nitrogen, hydrogen, helium, carbon, oxygen, titanium, iron, to modify the electrical conductivity of the implanted regions. In some instances, the ion may be chosen on the basis of higher atomic mass. For example, aluminum ions may be selected due to their greater atomic mass compared to hydrogen ions. The selected energy depends on the depth required of the ion implant. These energies can range from less than about 10 keV to greater than about 1 MeV to control implant at depths in a range from less than about 10 nm up to greater than about 1 μm, about 10 nm to about 750 nm, about 10 nm to about 500 nm, about 10 nm to about 250 nm, about 10 nm to about 100 nm, or any suitable sub-range or individual depth value within those ranges disclosed here. The ion dosage can also be used to control the number of implanted ions and therefore the modification in the electrical conductivity. Typical ion implant dosages can range from, but not are limited to about $10^{12}$ to $10^{16}$ $cm^{-3}$, based on the ion species and desired depth. Selecting an on the basis of higher atomic mass allows for reduced ion implant dosages (see Example 1). The energy of the ion implant source exposure can be used to control the depth of the ion implants made into doped III-nitride layer(s).

EC etching leaves the ion implanted regions or domains of the layer or layers intact with little (i.e., less than 5%, 4%, 3%, 2%, 1% porosity) to no porosification and porosifies only the doped regions or domains of the layer or layers of III-nitrides, which were not ion implanted. In some cases, it may be necessary to pattern or etch the layer or layers of III-nitrides to expose non-ion implanted (doped) regions or domains of the layer or layers of III-nitrides prior to applying the EC etching methods. The porosification of the doped regions or domains of the III-nitrides produces porosities within these regions or domains in the range of between about 1% and 90% or 20% and 80%. In some instances, the porosity is at least about 1%, 5%, 10%, 20%, 30%, 40%, 50%, 60%, 70%, 80%, or 90%. In some cases, the doped regions or domains of the III-nitride layer(s) are etched away completely under the EC etching conditions applied. The porosity of a given region or domain within III-nitride layer(s) following electrochemical (EC) etching is typically uniform across the given porosified region or domain, but may also be non-uniform. To measure porosity of the region or domain of III-nitride layer(s) which were porosified, the III-nitride layer(s) can be weighed, such as on a micro-balance, before and after porosification and the weight difference (loss) in the EC etched porosified over the original (before) weight can be expressed as a percentage to denote the degree of porosity. In some other instances, porosity may also be measured/estimated by imaging processing software, such as ImageJ, where scanning electron microscopy (SEM) images of the porosified III-nitride is used. There is very good agreement on the porosities calculated by the weighing (micro-balance) and image processing methods.

As noted above, the regions or domains within a doped layer or layers of III-nitrides, following the introduction of ion implants, which are porosified by EC etching are those which are non-ion implanted (i.e., protected from the ion implants by the ion implant mask layer(s)). The one or more regions or domains which are non-ion implanted and which can be porosified by an EC etching process can have any size, area, or shape based on the ion implant mask layer parameters (i.e., size, area, shape) and the ion implant exposure parameters (i.e., ion source and ion energy) which control the depth of the ion implant.

The porosification of pre-defined and selected regions or domains of the doped III-nitride layer(s) proceeds by an electrochemical (EC) etching process and different degrees of porosities and pore morphologies may be obtained by changing the type and concentration of electrolyte (either salt or acid), doping concentration, and applied bias voltage (as discussed below). The electric field direction during the EC etching process can control the direction of the etching direction and thereby control the direction of the pores etched into the pre-defined and selected regions or domains of the bulk doped III-nitride layer. In some instances, vertical etching produces columnar pores which are vertically aligned relative to the growth surface. In some other instances, lateral etching produces columnar pores which are laterally aligned relative to the growth surface. In still certain other instances, etching produces dendritic pore morphologies. Combinations of columnar and dendritic pores may also occur during etching.

The porosification of the pre-defined and selected regions or domains of III-nitride(s) produces nanoporous III-nitride(s) regions or domains within the given layer(s). The columnar vertically or laterally aligned pores formed in the III-nitride(s) during the EC etching process can have average lengths of about 5 to about 1000 nm, 5 to 900 nm, 10 to 800 nm, 10 to 700 nm, 10 to 600 nm, 10 to 500 nm, 10 to 400 nm, 10 to 300 nm, 10 to 200 nm, 10 to 100 nm, or 10 to 50 nm. In some cases, the average length is about 100 nm, 90 nm, 80 nm, 70 nm, 60 nm, 50 nm, 40 nm, 30 nm, 20 nm, or 10 nm. The vertically or laterally aligned pores may be further categorized as microporous ($d<2$ nm), mesoporous (2 nm$<d<$50 nm), or macroporous ($d>50$ nm); where d is the average pore diameter. The morphology of the formed pores may be classified as circular, semicircular, ellipsoidal, or a combination thereof. The pores may have an average size of between about 5 to 100 nm, 5 to 75 nm, 5 to 50 nm, or 5 to 25 nm. In some instances the average pore size is about 5, 10, 20, 30, 40, 50, 60, 70, 80, 90, 100 nm or greater. In some instances, based on the original doping concentration, the etchant used, and the applied voltage during the electrochemical porosification process, the average size of the pores can range from between less than about 20 nm to greater than 50 nm. The spacing between adjacent pores (which is also defines a measure of wall thickness of the pores) increases as a function of a lower applied bias and a lower doping concentration. The spacing between pores can range from between about 1 to 50 nm, 5 to 50 nm, 5 to 40 nm, 5 to 30 nm, 5 to 25 nm, 5 to 20 nm, 5 to 15 nm, or 5 to 10 nm.

The columnar vertically or laterally aligned pores are typically found in a parallel arrangement due to the pore growth mechanisms operating during EC etching. In additional to parallel pore propagation, branching and bifurcation of pores may also result. Accordingly, in certain instances the columnar vertically or laterally aligned pores may be interconnected between pores.

The dimensions of layer(s) of III-nitride described which include one or more domains or regions of porosified III-nitride therein can be of any size, area, or shape suitable for an application. In some instances, the area is in the range of between about 0.1 to 100 $cm^2$, 0.1 to 90 $cm^2$, 0.1 to 80 $cm^2$, 0.1 to 70 $cm^2$, 0.1 to 60 $cm^2$, 0.1 to 50 $cm^2$, 0.1 to 40 $cm^2$, 0.1 to 30 $cm^2$, 0.1 to 20 $cm^2$, 0.1 to 10 $cm^2$, 0.1 to 5 $cm^2$, or 0.1 to 1 $cm^2$. The porosified regions or domains within the layer(s) of III-nitride can vary laterally in size based on the ion implant mask, and the lateral size can range from between less than about 1 μm to greater than about 1 cm.

In some instances, the layer(s) of III-nitride can form part of a multilayer structure. The multilayer structure includes at least one layer of the III-nitride layer having porous regions or domains therein and further includes at least one layer of an optionally n-type doped hulk non-porous III-nitride. Within such multilayer structure, the at least one layer of the III-nitride layer can form an interface with the least one layer of optionally n-type doped bulk non-porous III-nitride. In some instances, the multilayer structure comprises multiple layers of each type, which may alternate in type, and multiple interfaces between the alternating pairs of layers are formed.

a. Optical Properties of Porous Regions or Domains of III-Nitrides

Incorporation of a low index material, such as air, into selected regions or domains of III-nitride by porosification of those regions or domains has the effect of lowering the refractive index, as compared to the bulk III-nitride. By varying the volumetric ratio of air (or porosity), it is possible to tune the refractive index of the porosified regions or domains selectively. The refractive index (n) of the porosified regions or domains of III-nitride layer(s) disclosed herein are in the range of between about 1 and 2.6 dependent on the degree of porosity (i.e., amount of air in the porous III-nitride), where the refractive index of air is about 1 (at STP) and the refractive index of a bulk (non-porous) III-nitride is about 2.6. In some cases, the porosified regions or domains of III-nitride layer(s) have a refractive index of about 1.1, 1.2, 1.3, 1.4, 1.5, 1.6, 1.7, 1.8, 1.9, 2, 2.1, 2.2, 2.3, 2.4, or 2.5. In certain instances, the refractive index of a porosified region or domain within III-nitride layer(s), such as GaN, is about 2.2 when the porosity of the region or domain therein is about 20%, about 1.9 when the porosity is about 40%, about 1.6 when the porosity is about 60%, or about 1.3 when the porosity is about 80%.

In some instances, the porosified regions or domains within III-nitride layer(s) may form interface(s) with other III-nitrides of different porosities (i.e., porous III-nitrides) or with non-porous (bulk) nitrides, each having a different index of refraction than the index of refraction of the porosified regions or domains of given III-nitride layer(s). This difference represents the refractive index contrast ($\Delta n$). It is preferred that the refractive index contrast between porosified III-nitride layer(s) and other III-nitrides is high and that $\Delta n$ is greater than 0.4 and more preferably greater than 0.5. In some instances, $\Delta n$ between porosified III-nitride layer(s) and other III-nitrides is at least about 0.5, 0.6, 0.7, 0.8, 0.9, 1, 1.1, 1.2, 1.3, 1.4, 1.5, or greater.

Varying the porosity of selected regions or domains within III-nitride layer(s), such as GaN, to between about 40 to 75% causes detuning by changing the refractive index and the Bragg condition. The peak wavelength of the stopband can therefore be varied by up to 30 nm. Highly reflective (>99.5%) DBR mirrors can be made containing the layer(s) of III-nitride having selected regions or domains of porosified III-nitride therein which emit in blue (440 nm), green (520 nm), and red (600 nm) wavelength ranges. The porosified regions or domains within the III-nitrides also exhibit negligible amounts of scattering.

b. Electrical Properties of Porous Regions or Domains of III-Nitrides

Varying the volumetric ratio of air (or porosity) in selected regions or domains of III-nitride, such as GaN, by porosification of those regions or domains can affect the electrical properties, as compared to the bulk (non-porous) equivalent III-nitride. For electrically injected devices, especially those requiring high current densities, good electrical transport is essential for high device performance.

In some instances, the porosification of selected regions or domains of III-nitride layer(s), as described herein, results in about an order of magnitude decrease in the electron concentration after the EC etching process has occurred. For example, in a doped III-nitride prior to porosification which was doped above $1\times10^{20}$ $cm^{-3}$, the resulting porous III-nitride layer(s) with a porosity of at least about 5%, 10%, 20%, 30%, 40%, 50%, or 60% can maintain a carrier (electron) concentration of above about $5\times10^{18}$ $cm^{-3}$ and electrical mobilities of at least about 50, 60, 70, 80, 90, 95 $cm^2/V$ s, or greater.

c. Thermal Properties of Porous Regions or Domains of III-Nitrides

For electrically injected devices, especially those requiring high current densities, efficient heat dissipation is essential for high device performance. For example, poor thermal conductivity (~1 W/m·K) has impeded the commercialization of such electrically injected devices.

The thermal conductivity across (or in the direction normal to) a structure having porous regions or domains within III-nitride layer(s), where heat transfer is normal to the layer(s), consists of adding up thermal resistance. Conversely, in the case of lateral heat spreading, this involves summing up the thermal conductance/conductivity of layers in parallel.

It is believed that the inclusion of porous regions or domains within III-nitride layers used in a multilayer structure, such as in a distributed Bragg reflector (DBR), provides an advantage of improved thermal conduction properties, where the porous regions or domains of III-nitride layer(s) contained within such a DBR can function at much lower operation temperatures, as compared to an equivalent device which does not contain porous regions or domains of III-nitride layers. The improved thermal conductance is also believed to benefit the threshold, power, and efficiency of such heat generating devices. These improvements in thermal conductivity are measured and compared against the thermal conductivity of epitaxial DBRs which are typically used III-nitrides. Epitaxial DBRs have low thermal conductivities which impede the device performance. Nanoporous DBRs as described here have higher thermal conductivity as compared to these conventional DBRs.

The thermal conductivity can be tuned based on the porosity and wall thickness within the porosified regions or domains of the III-nitride layer(s), such as GaN, and can be varied from below 1 to more than 20 W/m·K. In some instances, the thermal conductivity is in the range of between about 1 to 25, 2 to 20, 2 to 15, or 2 to 10 W/m·K. In still some other instances, the average thermal conductivity is at least about 1, 2, 3, 4, 5, 6, 7, 8, 9, 10, 11, 12, 13, 14, or 15 W/m·K. In some cases, a reduction in porosity leads to a moderate improvement in thermal conductivity, as a result of an increased effective medium. Widening the pore wall thickness can also improve the thermal conductivity owing to much reduced phonon interaction at the pores. For III-nitride layers having porous domains or regions therein with large pore wall thicknesses and small porosities, the thermal conductivity is capable of reaching to at least about 20, 30, 40, 50 W/m·K, which is useful for practical usage in photonic devices requiring fast heat dissipation.

III. Methods of Preparing III-Nitrides and Alloys Thereof Having Porous Regions or Domains Therein Unlike the photoelectrochemical (PEC) methods previously used, the conductivity selective electrochemical (EC) etching methods described herein rely on electrically injected holes, rather than photogenerated holes, to oxidize pre-determined domains and regions within bulk layer(s) of doped III-nitrides, such as GaN. The methods described herein do not require exposure to ultraviolet (UV) illumination. The etching behavior of the doped III-nitride is well controlled during the EC etching process by the incorporation of ion implants which reduce electrical conductivity and prevent porosification during EC etching. Thus, a variety of porosities and pore morphologies can be obtained by way of the ion implants introduced, as described below.

In one non-limiting example of the method, a III-nitride layer or layers having predefined regions or domains of porosity are formed by the steps of:

(a) growing or providing at least one layer of a doped III-nitride 100 over a first undoped III-nitride layer 140 (i.e., first layer) and growing or depositing a second undoped III-nitride layer 130 (i.e., second layer) over the at least one layer of doped III-nitride 100;

(b) forming or depositing an ion implant mask layer 150 over one or more areas of the second undoped III-nitride layer 130;

(c) implanting ions into the at least one layer of doped III-nitride to form ion implanted domains or regions 110 therein which have reduced electrical conductivity, as compared to non-ion implanted doped regions or domains in the at least one layer of a doped III-nitride;

(d) optionally removing the ion implant mask layer 150;

(e) optionally patterning or etching the doped and undoped III-nitride layers to form an opening 180 (i.e., a trench) to expose one or more regions or domains of the at least one layer of a doped III-nitride, which were not ion implanted during step (c); and (f) electrochemically (EC) etching the at least one layer of doped III-nitride in the presence of an electrolyte and under an applied bias voltage to form one or more etched regions or domains within 120 each comprising a plurality of pores in the exposed one or more regions or domains of the doped III-nitride, which were not ion implanted during step (c).

The at least one layer of a doped III-nitride, such as GaN, can be epitaxially or homoepitaxially grown according to art known methods, such as metal organic chemical vapor deposition (MOCVD) or molecular beam epitaxy (MBE). The first undoped III-nitride layer (i.e., first layer) and second undoped III-nitride layer (i.e., second layer) can also be epitaxially or homoepitaxially grown according to art known methods. The second undoped III-nitride layer may also be formed first and subsequently deposited onto the at least one layer of a doped III-nitride in certain instances. Each layer of doped or undoped III-nitride provided or deposited may have a thickness in a range of between about 10 to 10,000 nm, 10 to 1000 nm, 10 to 500 nm. In instances where more than one layer of III-nitride is present each layer may be independently doped or undoped, as described below. In still some other instances, the one or more layers of III-nitrides alternate between doped or undoped layers allowing for controlled porosification of the doped III-nitride layers by introduction of ion implants into regions or domains within the doped III-nitride layers.

Porosification by EC etching requires that the bulk III-nitride layer(s) be doped with an n-type dopant. Accordingly, the at least one layer of a doped III-nitride is be doped during deposition/formation. Exemplary dopants can include, but are not limited to n-type Ge and Si dopants. Such dopant sources can include, for example, silane ($SiH_4$), germane ($GeH_4$), and isobutylgermane (IBGe). It is preferred that the III-nitrides which are porosified are aluminum free or substantially free of aluminum (where "substantially free" means less than about 5%, 4%, 3%, 2%, 1%, 0.9%, 0.8%, 0.7%, 0.6%, 0.5%, 0.4%, 0.3%, 0.2%, or 0.1% aluminum by weight in the doped III-nitride layer). The doping concentration can be uniform across the entirety of a doped III-nitride layer or the doping concentration may form a gradient (i.e., a graded dopant concentration across an axis of the layer, such width). The doping concentration is considered high at doping concentration levels of at least about $1\times10^{20}$ cm$^{-3}$ or higher; or in the range of between about $0.5\times10^{20}$ cm$^{-3}$ to $10\times10^{20}$ cm$^{-3}$. The doping concentration is considered to be moderate at doping concentration levels of greater than about $1\times10^{18}$ cm$^{-3}$ to less than $1\times10^{20}$ cm$^{-3}$, $2\times10^{18}$ cm$^{-3}$ to less than $1\times10^{20}$ cm$^{-3}$, $3\times10^{18}$ cm$^{-3}$ to less than $1\times10^{20}$ cm$^{-3}$, $4\times10^{18}$ cm$^{-3}$ to less than $1\times10^{20}$ cm$^{-3}$, or $5\times10^{18}$ cm$^{-3}$ to less than $1\times10^{20}$ cm$^{-3}$. In some instances, the moderately doped concentration level is in the range of $1\times10^{19}$ cm$^{-3}$ to less than $1\times10^{20}$ cm$^{-3}$ or in the range of about $0.5\times10^{19}$ cm$^{-3}$ to $10\times10^{19}$ cm$^{-3}$. The doping concentration is considered to be low at doping concentration levels of less than about $1\times10^{18}$ cm$^{-3}$ or in the range of between about $0.5\times10^{18}$ cm$^{-3}$ to $10\times10^{18}$ cm$^{-3}$. Porosification by electrochemical (EC) etching is limited to domains or regions of III-nitride which are doped at moderate to high concentrations.

Introducing ion implant mask layer(s) over one or more areas of the undoped layer protects the masked areas from ion implants. The one or more regions or domains which are non-ion implanted and which can be porosified by the EC etching process can have any size, area, or shape based on the ion implant mask layer parameters (i.e., size, area, shape) and the ion implant exposure parameters (i.e., ion source and energy) which control the depth of the ion implant. The shapes within each of the porosified regions or domains can vary from straight lines to curved lines, sharp edges, circular paths, and combinations thereof, or they can form any shape that was protected during the ion implant stage. The thickness of the porosified layer can range from between from about 10 nm to at least about 1 μm, or greater. The ion implant mask layer can be made, without limitation, using known surface masking techniques to form a masked region on the undoped layer prior to ion implantation.

Ion implant mask layer(s) can be formed using several methods. Without limitation, some examples include:

(1) Photoresist method: A layer of photoresist is spin coated onto a substrate. Then using photolithography, electron beam lithography or stamping techniques, the photoresist mask layer can be pattered into the desired shape. Based on the source of ions and ion energies used, the mask layer can vary from less than about 1 μm to greater than 10 μm, as needed.

(2) Hard mask, etching method: A hard mask layer of a material is deposited. This material can be dielectric (such as, for example, silicon dioxide or silicon nitride) or a metal, such as titanium, aluminum, etc. Based on the material, different deposition techniques can be used such as, for example, thermal evaporators, electron beam evaporators, sputters, spin coating, chemical vapor deposition, atomic layer depositions, etc. Then a layer of photoresist can be spin coated and patterned on top of the deposited hard mask layer of material. Then the hard mask layer of material can be etched away, either chemically or physically, in order to transfer the patterns from the photoresist to the underlying layer of the material.

(3) Hard mask, liftoff method: Similar to the above technique (hard mask, etching method) but carried out in reverse order. First, a layer of photoresist is spin coated and then patterned. Then, a hard mask layer is deposited on top of the photoresist using one of the techniques previously described in (2). The photoresist is then etched away causing the lifting off of regions within the hard mask layer thus transferring the pattern to the hard mask layer.

The ion implant mask layer region(s) can have any suitable pattern, size, shape, area, or depth. In some instances, the area of the ion implant mask layer covers a range of between about 0.1 to 100 cm$^2$, 0.1 to 90 cm$^2$, 0.1 to 80 cm$^2$, 0.1 to 70 cm$^2$, 0.1 to 60 cm$^2$, 0.1 to 50 cm$^2$, 0.1 to 40 cm$^2$, 0.1 to 30 cm$^2$, 0.1 to 20 cm$^2$, 0.1 to 10 cm$^2$, 0.1 to 5 cm$^2$, or 0.1 to 1 cm$^2$. In some instances, the depth or thickness of the ion implant mask layer(s) can range from between about 1 μm to greater than 10 μm, and sub-ranges within.

The methods described rely on introduction of one or more ion implants into pre-defined and selected regions or domains within the at least one doped III-nitride layer allowing for a reduction in the electrical conductivity of the ion implanted regions sufficient to prevent their porosification under EC etching conditions. The reduction in electrical conductivity caused by introducing ion implants into doped regions or domains of the III-nitride layer(s) can be by at least 10, 20, 30, 40, 50, 60, 70, 80, or 90%, as compared to the electrical conductivity prior to ion implantation. The non-ion implanted doped regions or domains in the at least one layer of a doped III-nitride retain at least the same electrical conductivity, as compared to the bulk pristine III-nitride, or greater than about 99%, 95%, 90% of the electrical conductivity. The use of an ion implant mask layer also allows for the creation of micro-scale patterns which permit selective porosification of only doped regions or domains of the layer or layers of III-nitrides, which were masked and not exposed to ion implants. The ion implants are made by exposing the exposed doped III-nitride to ions from various ion sources. Various ion species and sources can be used, such as aluminum, gold, nitrogen, hydrogen, helium, carbon, oxygen, titanium, iron, to modify the electrical conductivity of the implanted regions. In some instances, the ion may be chosen on the basis of higher atomic mass. For example, aluminum ions may be selected due to their greater atomic mass compared to hydrogen ions. The selected energy depends on the depth required of the ion implant. These energies can range from less than about 10 keV to greater than about 1 MeV to control implant at depths in a range from less than about 10 nm up to greater than about 1 μm, about 10 nm to about 750 nm, about 10 nm to about 500 nm, about 10 nm to about 250 nm, about 10 nm to about 100 nm, or any suitable sub-range or individual depth value within those ranges disclosed here. The ion dosage can also be used to control the number of implanted ions and therefore the modification in the electrical conductivity. Typical ion implant dosages can range from, but not are limited to about $10^{12}$ to $10^{16}$ cm$^{-3}$, based on the ion species and desired depth. Selecting an on the basis of higher atomic mass allows for reduced ion implant dosages (see Example 1). The ion implant step can be repeated one or more times, as needed, and with one type or multiple types of ion sources to introduce multiple implants and types of ion implants, if necessary. The energy of the ion implant source exposure can be used to control the depth of the ion implants made into doped III-nitride layer(s).

Based on the pattern, size, shape, or area of the ion mask layer(s) the resulting ion implanted regions or domains formed in the at least one layer of a doped III-nitride can have any suitable pattern, size, shape, area, or depth. In one non-limiting example, as shown in an optical image of an ion implanted sample in FIG. 2, it is possible to introduce both continuous and non-continuous ion implanted regions or domains 110 in a doped III-nitride layer. Following step (c) the ion implant mask layer is typically removed prior to performing EC etching.

The one or more regions or domains which are non-ion implanted due to protection from the ion mask layer(s), and which can be porosified by an EC etching process, can have any size, area, or shape based on the ion implant mask layer parameters (i.e., size, area, shape) and the ion implant exposure parameters (i.e., ion source and energy) which control the depth of the ion implant.

Figure 3:
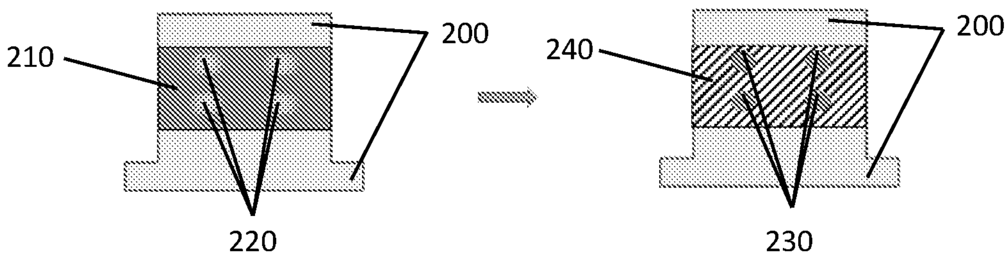
FIG. 3 shows a non-limiting representation of a process to form a photonic crystal having non-porous III-nitride islands 230 within a porous III-nitride matrix 240 which was formed from a sample having ion implants 220 at different depths within doped III-nitride layer 210 in between undoped layers of III-nitride 200.
Figure 4:
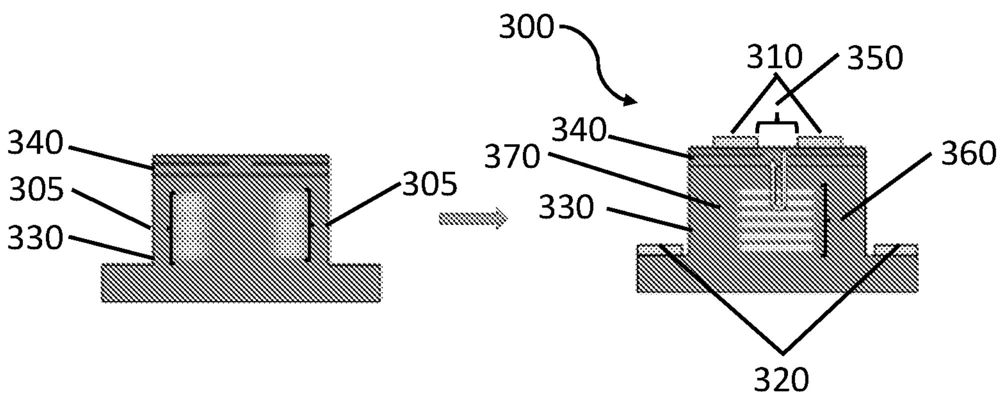
FIG. 4 shows a non-limiting representation of a process of forming ion implants 305 in a mesa structure 330 having an active region 340 from which a vertical cavity surface-emitting laser (VCSEL) 300 is formed having metal contacts 310 and 320, a porous III-nitride distributed Bragg reflector (DBR) region 360, non-porous III-nitride region 370, and an aperture region 350.

In some cases, the ion implant step can be performed at different depths enabling the formation of one or more defined ion implanted domains or regions, to form islands of non-porous III-nitride 230, such as GaN, which are embedded in a three-dimensional matrix of porous III-nitride 240 (see FIG. 3). Such a process enables forming 3D photonic crystals.

During step (f), the EC etching leaves the ion implanted regions or domains of the layer or layers intact with little (less than 5%, 4%, 3%, 2%, 1%, or less) to no porosification and porosifies only the doped regions or domains of the layer or layers of III-nitrides, which were not ion implanted. The degree of porosity of doped regions or domains within III-nitride layer(s) which were not ion implanted can be controlled as a function of two parameters: the doping (carrier) concentration and the anodization or applied bias voltage. The porosification of the doped regions or domains of the III-nitrides produces porosities within these regions or domains in the range of between about 10% and 90% or 20% and 80%. In some instances, the porosity is at least about 10%, 20%, 30%, 40%, 50%, 60%, 70%, 80%, or 90%. In some cases, the doped regions or domains of the III-nitride layer(s) are etched away completely under the EC etching conditions applied. The porosity of a given region or domain within III-nitride layer(s) following electrochemical (EC) etching is typically uniform across the given porosified region or domain, but may also be non-uniform. To measure porosity of the region or domain of III-nitride layer(s) which were porosified, the III-nitride layer(s) can be weighed, such as on a micro-balance, before and after porosification and the weight difference (loss) in the EC etched porosified over the original (before) weight can be expressed as a percentage to denote the degree of porosity. In some other instances, porosity may also be measured/estimated by imaging processing software, such as ImageJ, where scanning electron microscopy (SEM) images of the porosified III-nitride is used. There is very good agreement on the porosities calculated by the weighing (micro-balance) and image processing methods.

Porosification by the electrochemical (EC) etching process of step (f) can produce different porosities and pore morphologies by changing the type and concentration of electrolyte, doping concentration, and applied bias voltage (as discussed below). The applied bias voltage is typically a positive voltage in the range of about 0.1 to 10 V, 1.0 to 5V, or 1.0 to 2.5V. In some instances, based on the original doping concentration, the required porosity, and the type of etchant used, the applied bias ranges from less than about 1V to at least about 10V, or greater. The electric field direction during the EC etching process can control the direction of the etching direction and thereby control the direction of the pores etched into the non-ion implanted doped regions or domains of a III-nitride layer. In some instances, vertical etching produces columnar pores which are vertically aligned, while in some other instances lateral etching produces columnar pores which are laterally aligned.

During step (f) of the methods described, the EC etching direction is determined by the electric field direction. Depending on the III-nitride/electrolyte interface, the EC etching can be controlled to be in a vertical etching or lateral etching direction. The rate of vertical or lateral porosification during step (b) can be about 0.1 μm/min, 0.2 μm/min, 0.3 μm/min, 0.4 μm/min, 0.5 μm/min, 0.6 μm/min, 0.7 μm/min, 0.8 μm/min, 0.9 μm/min, 1 μm/min, 2 μm/min, 3 μm/min, 4 μm/min, 5 μm/min, 6 μm/min, 7 μm/min, 8 μm/min, 9 μm/min, or 10 μm/min. The EC etching of step (b) can be carried out under an applied bias voltage from about 1 min to 24 hours, 1 min to 12 hours, 1 min to 6 hours, 1 min to 4 hours, 1 min to 2 hours, 1 min to 1 hour, or 1 min to 30 minutes. In some instances, the EC etching of step (f) is carried out under an applied bias voltage for at least about 5 min, 10 min, 15 min, 20 min, 25 min, 30 min, 35 min, 40 min, 45 min, 50 min, 55 min, 60 min, 2 hours, 3 hours, 4 hours, 5 hours, 6 hours, 10, hours, 15 hours, 20 hours, 24 hours, or greater. The EC etching of step (f) can be carried out under an applied bias voltage at room temperature or at a temperature in the range of about 10° C. to about 50° C. The EC etching of step (f) can be carried out under an applied bias voltage under ambient conditions or optionally under an inert atmosphere (such as of nitrogen or argon).

The EC etching carried out in step (f) of the methods described can be carried out in different types and concentrations of a high conductivity electrolyte (either salt or acid). Exemplary high conductivity electrolytes can include, but are not limited to hydrofluoric acid (HF), nitric acid ($HNO_3$), and organic acids and their salts (such as oxalic acid). The concentration of the electrolyte solutions are typically in the range of between 0.1 to 1M.

The optional patterning or etching of step (e) can be performed, for example, by lithographically patterning one or more openings known as "via trenches," such as a 1D array of trench(es). Suitable etching techniques, such as inductively coupled plasma reactive-ion etching (ICP-RIE), can be used to etch down III-nitride layer(s) to expose the doped layer(s) sidewalls.

The conductivity selective electrochemical (EC) etching process of step (f), which selectively etches doped regions or domains of doped III-nitride which were not ion implanted, is believed to proceed by an anodic etching reaction which involves four steps:

(1) charge carrier transport in the space-charge region;
(2) oxidation of the doped III-nitride surface;
(3) dissolution of oxides formed; and
(4) transport of products.

The III-nitride/electrolyte interface is understood to behave as a Schottky diode. Under a positive bias, holes ($h^+$) are generated near the surface of the doped III-nitride by tunneling or impact ionization and the holes are swept by electric field onto the III-nitride surface for subsequent oxidation reaction. As an example, the oxidation of GaN generates $Ga^{3+}$ ions and nitrogen gas (Youtsey, et al. Appl. Phys. Lett. 71, 2151-2153 (1997)).

$$GaN|3h^{+} > Ga^{3+}|\tfrac{1}{2}N_2\uparrow$$

Near the cathode, hydrogen gas is formed by hydrogen ion reduction reaction.

$$H^{+} + e^{-} \rightarrow \frac{1}{2}H_2\uparrow$$

The reduction reaction completes the charge transfer circle of the electrochemical (EC) process.

During the EC etching process of step (f), porosification is believed to result from random electrostatic breakdown with the injection of holes (h+) to certain localized hot spots, resulting in the formation of porous nucleates through localized dissolution in the doped regions or domains within the III-nitride layer(s) which were not ion implanted. After the initial formation of pore nucleates, pore formation is driven by the electric field. The electric field around the planar depletion region (with width d and barrier height 4) and at the tip of the pores (with radius r) are described according to the following functions:

$$E_{planar} = \frac{2\Phi}{d}$$

and $$E_{pore-tip} = \frac{\Phi}{r},$$

respectively (Chen, et al. J. Appl. Phys. 112, 064303 (2012)). Usually the pore tip radius is much smaller than the depletion layer width d, thus the porosification is believed to occur the fastest at the pore tips, resulting in columnar porous structures. Both aligned and branch-like or bifurcating pores can also be observed under certain doping concentrations and applied biases. The difference in pore morphology can be understood by comparing the inter-pore spacing (or wall thickness $d_w$ that is related with the initial pore nucleation density) and the space charge region width ($d_{sc}$). When $d_w$>2 $d_{sc}$, sufficient current pathways exist between pores and reverse breakdown takes place in between pores and at the tips, causing branching and bifurcation of pores in additional to parallel pore propagation. When $d_w$<2 $d_{se}$, arranged pore morphologies can be obtained due to the coalescence of the depletion regions around adjacent pores.

The incorporation of low index materials, such as air, into porosified regions or domains within III-nitride layer(s) can lower the refractive index. The EC etching allows for tunability in the refractive index of the porosified regions or domains of III-nitrides. The refractive index (n) of a porosified or porous region or domain within III-nitride layer(s) can range from between about 1 and 2.6 dependent on the degree of porosity (i.e., amount of air in the porous III-nitride), where the refractive index of air is about 1 (at STP) and the refractive index of a bulk (non-porous) III-nitride is about 2.6. In some cases, the porous region or domain within III-nitride layer(s) has a refractive index of about 1.1, 1.2, 1.3, 1.4, 1.5, 1.6, 1.7, 1.8, 1.9, 2, 2.1, 2.2, 2.3, 2.4, or 2.5. In certain instances, the refractive index of a porous region or domain within III-nitride layer(s), such as a porous GaN, is about 2.2 when the porosity is about 20%, about 1.9 when the porosity is about 40%, about 1.6 when the porosity is about 60%, or about 1.3 when the porosity is about 80%. The porosified region or domain within III-nitride layer(s) can interface with other III-nitrides (either porous or non-porous (bulk) nitrides) can have a different index of refraction than the index of refraction of the interfacing layer. This difference represents the refractive index contrast (Δn). It is preferred that the refractive index contrast between porosified regions or domains of III-nitride layer(s) and other III-nitrides is high and that Δn is greater than 0.4 and more preferably greater than 0.5. In some instances, Δn between porosified III-nitride layer(s) and other III-nitrides is at least about 0.5, 0.6, 0.7, or 0.8.

The methods described can also be used to tune the electrical properties of the porous regions or domains within doped III-nitride layer(s), as compared to the bulk (non-porous) equivalent III-nitride. In some instances, the porosification of III-nitride, as described herein, results in about an order of magnitude decrease in the electron concentration after the EC etching process has occurred. For example, in a doped III-nitride prior to porosification which was doped above $1\times10^{20}$ cm$^{-3}$, the resulting porous III-nitride layer(s) with a porosity of at least about 5%, 10%, 20%, 30%, 40%, 50%, or 60% can maintain a carrier (electron) concentration of above about $5\times10^{18}$ cm$^{-3}$ and electrical mobilities of at least about 50, 60, 70, 80, 90, 95 cm$^2$/V s, or greater.

The methods described also allow for the thermal conductivity of III-nitrides to be tuned based on the porosity and average pore wall thickness of the resulting porosified regions or domains within the doped III-nitride layer(s). These can be varied from below 1 to more than 20 W/m·K. In some instances, the thermal conductivity is in the range of between about 1 to 25, 2 to 20, 2 to 15, or 2 to 10 W/m·K. In still some other instances, the average thermal conductivity is at least about 1, 2, 3, 4, 5, 6, 7, 8, 9, 10, 11, 12, 13, 14, or 15 W/m·K.

IV. Methods of Using Porous III-Nitrides and Alloys Thereof

The one or more layers of III-nitride(s), which have controllably localized and etched porous regions or domains therein, can be used in electronic, photonic, and optoelectronic applications. The spatial control in porosity can impact in several applications which require three-dimensional control over the optical, electrical, thermal or mechanical properties of III-nitrides. These can include, but are not limited to optoelectronic devices including light-emitting diodes (such as, resonant-cavity LEDs (RC-LEDs)), field-effect transistors, laser diodes (vertical-cavity surface-emitting lasers (VCSELs)), distributed feed back (DFB) laser and edge emitting lasers, 3-D photonic crystals, flexible membranes, micro- and nano-fluidics, biomedical diagnostics, bio-platforms, and water splitting. Such layers can prepared according to the methods described herein and these can be incorporated into different devices using art known techniques.

The one or more layers of III-nitride(s), which have controllably localized and etched porous regions or domains therein, can form be formed into alternating layer pairs in order to have the same lattice constant. Each alternating pair represents a distributed Bragg reflector (DBR) where in some instances there may be 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, or greater alternating pairs in a multilayer structure. Generally, the number of interfaces in a given DBR structure is twice the number of alternating pairs, such that, for example, a 20 pair DBR should have 40 interfaces.

The one or more layers of III-nitride(s), which have controllably localized and etched porous regions or domains therein, when used in DBRs, for example, can exhibit high reflectance/reflectivity values where the peak reflectance is at least about 99%, 99.1%, 99.2%, 99.3%, 99.4%, 99.5%, 99.6%, 99.7%, 99.8%, or 99.9%. It is most preferred for the reflectance to be at least 99.5% or greater. For one or more layers of III-nitride(s), which have controllably localized and etched porous regions or domains therein, when used in DBRs, it is also possible to reproducibly obtain a stopband (range of wavelengths reflected by the DBR structure) of at least about 50, 60, 70, or 80 nm in range. The peak wavelength of the stopband can be varied up to 10, 20, 30 nm for a blue DBR. In some instances, peak reflectances exceeding 99.8%, at a central wavelength of 460 nm with a stop band of more than 50 nm can be achieved.

DBR mirrors comprising one or more layers of III-nitride(s), which have controllably localized and etched porous regions or domains therein, can have tuned emission in the ultraviolet (i.e., <400 nm), violet (i.e., about 400-420 nm), blue, green, and red wavelength ranges. In the blue range, emission may occur at a peak value of about 440, 450, or 460 nm. In the green range, emission may occur at a peak value of about 520 nm. In the red range, emission may occur at a peak value of about 600 nm. Other peak values in the blue, green, and red wavelength ranges are possible. Further, emission may also be at near ultraviolent, ultraviolent, near infrared, and infrared wavelengths.

The area of the one or more layers of III-nitride(s), which have controllably localized and etched porous regions or domains therein, in DBR region can be sufficiently large for the fabrication of vertical-cavity surface-emitting lasers (VCSELs) and resonant-cavity LEDs (RC-LEDs). In some instances the area of the DBR region is at least about or can exceed about 1, 2, 3, 4, 5, 10, 20, 30, 40, or 50 μm.

The inclusion of selective porosity regions or domains in III-nitride-containing reflectors/mirrors provides the option of a conductive mirror to support vertical current injection vital in attaining high performance VCSELs with excellent optical and electrical performance, as compared to previously reported VCSELs. VCSELs have many advantages compared to more commonly used edge emitting laser diodes (EELDs) such as superior beam quality, compact form factor, low operating power, cost-effective wafer-level testing, higher yield and lower cost in manufacturing. VCSELs, in general, are expected to find important applications in various fields including information processing, micro-display, pico-projection, laser headlamps, high-resolution printing, biophotonics, spectroscopic probing, and atomic clocks.

EXAMPLES

Example 1

Materials and Methods:

A 50 nm thick GaN layer doped with Ge was sandwiched between to undoped GaN layers. Then, using photolithography an ion implant mask was formed on the surface of the undoped GaN layers. Different samples were ion implanted with different ion species and different dosages. Next, trenches were formed to expose the side walls of the doped GaN layer. After fabrication, the sample were EC etched using nitric acid as the electrolyte.

Results & Characterization:

Ion implant profiles consisted of both continuous (i.e., an ion implant linear region) and non-continuous (i.e., an ion implant broken (dashed) linear region) regions within the doped GaN. The EC etching initiated and proceeded from the edges of the trenches.

Samples implanted with proton (hydrogen) implants at $10^{13}$ ion/cm$^2$ dosages did not show any porosification selectivity between the implanted and non-implanted regions showing that the reduction in conductivity was not enough to slow the EC etching process. Therefore, samples were implanted with higher dosages $10^{15}$ ion/cm$^2$ in order to cause further damage and thus cause further reduction within the electrochemical (EC) etching. Indeed, the difference in the etching rate between the EC etched and non-EC etched regions was observed in FIG. 2A. However, considerable etching occurred though the ion implanted region as can be seen in the wavy EC etching front in FIG. 2A.

In order to increase the crystal damage occurring during an ion implant, aluminum ions were used. Due to the higher atomic mass of aluminum compared to hydrogen (27×), the dosage was reduced from $10^{15}$ ion/cm$^2$ to $10^{13}$ ion/cm$^2$. After EC etching, the porosification was completely blocked in the ion implanted regions, as observed in FIG. 2B. Thus, it was observed that porosification did not proceed past the ion implanted line under these conditions. Furthermore, the shape of the etching fronts showed how the etching only proceeding from the non-ion implanted regions between the non-continuous ion implanted regions. This demonstrated that EC etching can be laterally controlled through the introduction of ion-implants.

Example 2

Figure 2A:
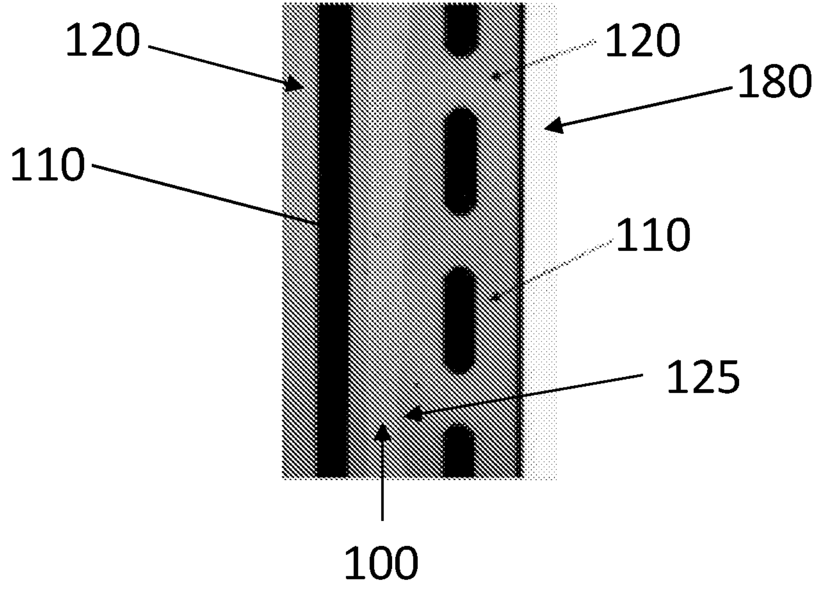
FIG. 2A shows an optical micrograph of an ion implanted sample after porosification in a doped III-nitride layer 100 surrounded by trenches or vias 180, continuous and discontinuous ion implanted regions or domains 110, etched and porosified regions or domains 120, and showing etching fronts 125.
Figure 2B:
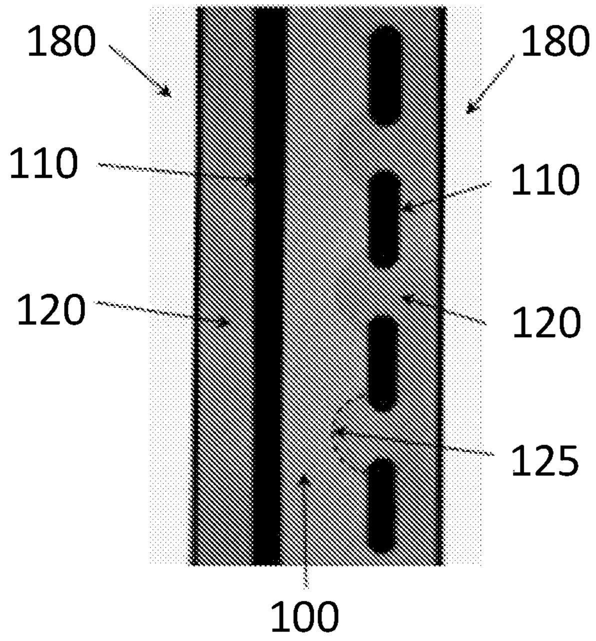
FIG. 2B shows an optical micrograph of an ion implanted sample after porosification in a doped III-nitride layer 100 surrounded by trenches or vias 180, continuous and discontinuous ion implanted regions or domains 110, etched and porosified regions or domains 120, and showing etching fronts 125.
Figure 2C:
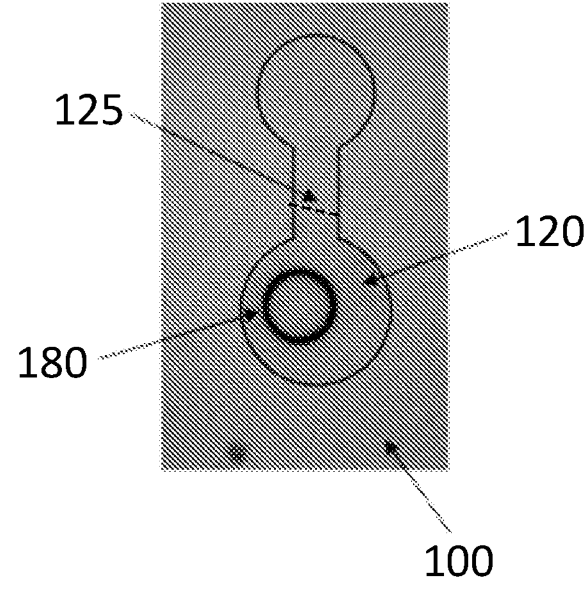
FIG. 2C shows an optical micrograph of an ion implanted sample after porosification in a doped III-nitride layer 100 surrounded by via 180, etched and porosified regions or domains 120, and showing etching front (dashed line) 125.
Figure 2D:
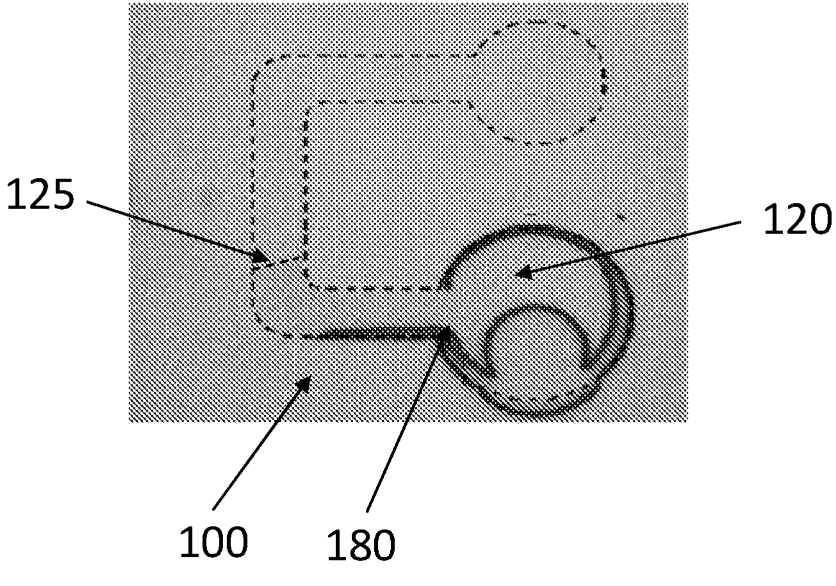
FIG. 2D shows an optical micrograph of an ion implanted sample after porosification in a doped III-nitride layer 100 surrounded by via 180, etched and porosified regions or domains 120, and showing etching front (dashed line) 125.

Materials and Methods:

To study how much the EC etching could be localized, two structures as shown in FIGS. 2C and 2D were fabricated using the techniques of Example 1.

Results & Characterization:

As shown in the structure in FIG. 2C, a 5 μm non-ion implanted channel was formed which was then laterally etching through a via. Regions outside the black contour were implanted. As observed, the electrochemical (EC) etching proceeded from the etched via into the surrounding, then proceeded through the narrow channel. No EC etching occurred within the ion implanted region.

A second similar structure was formed, as shown in FIG. 2D, but with the channel bent 90 degrees. As observed, the EC etching followed the non-ion implanted region and no etching was observed within the ion implanted region.

These results demonstrate the ability to control etching by ion implantation.

Unless defined otherwise, all technical and scientific terms used herein have the same meanings as commonly understood by one of skill in the art to which the disclosed invention belongs. Publications cited herein and the materials for which they are cited are specifically incorporated by reference.

Those skilled in the art will recognize, or be able to ascertain using no more than routine experimentation, many equivalents to the specific embodiments of the invention. Such equivalents are intended to be encompassed by the following claims.

We claim:

1. A III-nitride layer comprising one or more porous regions or domains within the III-nitride layer each comprising a plurality of pores;

one or more non-porous regions or domains comprising ions implanted therein that reduce electrical conductivity of the one or more non-porous regions or domains;

wherein the reduction of the electrical conductivity is sufficient to prevent porosification of the one or more non-porous regions or domains under electrochemical etching conditions; and wherein the reduction of the electrical conductivity is at least 10%, as compared to the electrical conductivity without the ions implanted therein.

2. The III-nitride layer of claim 1, wherein the III-nitride layer is selected from aluminum nitrides, gallium nitrides, indium nitrides, and alloys thereof.

3. The III-nitride layer of claim 1, wherein the III-nitride layer is doped with an n-type dopant.

4. The III-nitride layer of claim 1, wherein porosity of the one or more porous regions or domains within the III-nitride layer is in a range of between about 1% and 90% or 20% and 80%.

5. The III-nitride layer of claim 1, wherein porosity of the one or more porous regions or domains within the III-nitride layer is at least about 1%, 5%, 10%, 20%, 30%, 40%, 50%, 60%, 70%, 80%, or 90%.

6. The III-nitride layer of claim 1, wherein the plurality of pores are dendritic pores, columnar pores, or combinations thereof.

7. The III-nitride layer of claim 1, wherein the one or more porous regions or domains are microporous, mesoporous, or macroporous.

8. The III-nitride layer of claim 1, wherein the III-nitride layer has a refractive index in the range of between about 1 to 2.6 or 1.1 to 2.5.

9. The III-nitride layer of claim 1, wherein the one or more porous regions or domains within the III-nitride layer each have a porosity of at least about 5%, 10%, 20%, 30%, 40%, 50%, or 60% and the layer maintains a carrier (electron) concentration of above about $5\times10^{18}$ $cm^{-3}$ and electrical mobilities of at least about 50, 60, 70, 80, 90, or 95 $cm^2/V$ s.

10. The III-nitride layer of claim 1, wherein the III-nitride has a thermal conductivity in a range of between about 1 to 25, 2 to 20, 2 to 15, or 2 to 10 W/m·K.

11. A multilayer structure comprising at least one layer of the III-nitride layer of claim 1 and further comprising at least one layer of an optionally n-type doped bulk non-porous III-nitride.

12. The multilayer structure of claim 11, wherein the at least one layer of the III-nitride layer forms an interface with the least one layer of optionally n-type doped bulk non-porous III-nitride.

13. The multilayer structure of claim 11, wherein the at least one layer of the III-nitride layer and the at least one layer of optionally n-type doped bulk non-porous III-nitride have different indices of refraction and have a refractive index contrast.

14. A method of making the III-nitride layer of claim 1, the method comprising the steps of:

(a) growing or providing at least one layer of a doped III-nitride over a first undoped III-nitride layer and growing or depositing a second undoped III-nitride layer over the at least one layer of doped III-nitride;

(b) forming or depositing an ion implant mask layer over one or more areas of the second undoped III-nitride layer;

(c) implanting ions into the at least one layer of doped III-nitride to form ion implanted domains or regions therein which have reduced electrical conductivity, as compared to non-ion implanted regions or domains in the at least one layer of doped III-nitride;

(d) optionally removing the ion implant mask layer;

(e) optionally patterning or etching the doped and undoped III-nitride layers to form an opening to expose one or more regions or domains of the at least one layer of a doped III-nitride which are not ion implanted; and (f) electrochemically (EC) etching the at least one layer of doped III-nitride in the presence of an electrolyte and under an applied bias voltage to form one or more etched regions or domains within comprising a plurality of pores in the one or more regions or domains of the doped III-nitride layer which were not ion implanted during step (c).

15. The method of claim 14, wherein the at least one layer of a doped III-nitride is doped with an n-type dopant selected from a Ge dopant, Si dopant, or combination thereof.

16. The method of claim 14, wherein the at least one layer of a doped III-nitride is in a range of between about $0.5\times10^{20}$ $cm^{-3}$ to $10\times10^{20}$ $cm^{-3}$; and/or in a range of between about $1\times10^{19}$ $cm^{-3}$ to less than $1\times10^{20}$ $cm^{-3}$ or in a range of between about $0.5\times10^{19}$ $cm^{-3}$ to $10\times10^{19}$ $cm^{-3}$; and/or in a range of between about $0.5\times10^{18}$ $cm^{-3}$ to $10\times10^{18}$ $cm^{-3}$.

17. The method of claim 14, wherein the ion implanting of step (c) forms ion implanted domains or regions comprising ions of aluminum, gold, nitrogen, hydrogen, helium, carbon, oxygen, titanium, iron, or combinations thereof; optionally wherein the ions implanted during ion implanting step (c) have an ion implant dosage ranging from between about $10^{12}$ to $10^{16}$ ions/$cm^{-3}$.

18. The method of claim 14, wherein following step (f) porosity of the one or more etched regions or domains are each independently in a range of between about 10% and 90% or 20% and 80%.

19. The method of claim 14, wherein during step (f) the plurality of pores are formed by EC etching in a direction determined by electric field direction.

20. The method of claim 14, wherein following step (f) the doped III-nitride layer comprising the one or more etched regions or domains within has a refractive index contrast at an interface with undoped III-nitride layers.

21. The method of claim 20, wherein the refractive index contrast (An) is greater than 0.4 or greater than 0.5.

22. A device comprising the porous III-nitride of claim 1.

23. The device of claim 22, wherein the device is selected from light-emitting diodes, field-effect transistors, laser diodes, flexible membrane devices, micro- and nano-fluidic devices, biomedical diagnostic devices, bio-platform devices, and water splitting devices.

24. The device of claim 22, wherein the device is a distributed Bragg reflector (DBR) mirror.

25. The device of claim 24, wherein the DBR mirror forms part of a vertical cavity surface-emitting laser (VCSEL).

26. The III-nitride layer of claim 1, wherein the ions implanted comprise ions of aluminum, gold, nitrogen, hydrogen, helium, carbon, oxygen, titanium, iron, and combinations thereof.

* * * * *